United States Patent [19]

Khattab

[11] 4,444,836

[45] Apr. 24, 1984

[54] METAL PLATED POLYAMIDE ARTICLES

[75] Inventor: Ghazi M. A. Khattab, Succasunna, N.J.

[73] Assignee: Allied Corporation, Morris Township, Morris County, N.J.

[21] Appl. No.: 420,431

[22] Filed: Sep. 20, 1982

Related U.S. Application Data

[63] Continuation of Ser. No. 75,855, Sep. 17, 1979, which is a continuation-in-part of Ser. No. 935,044, Sep. 18, 1978, abandoned, which is a continuation-in-part of Ser. No. 849,146, Nov. 7, 1977, abandoned.

[51] Int. Cl.$^3$ ............................................... B32B 5/16
[52] U.S. Cl. .................................... 428/330; 427/305; 427/306; 427/307; 428/458; 428/331; 523/212; 523/213; 524/493
[58] Field of Search ............... 428/458, 457, 331, 330; 427/305, 307, 306; 523/212, 213; 524/493, 790

[56] References Cited

U.S. PATENT DOCUMENTS

| | | | |
|---|---|---|---|
| 3,419,517 | 12/1968 | Hedrick et al. | 523/212 |
| 3,466,232 | 9/1969 | Francis et al. | 204/30 |
| 3,830,777 | 8/1974 | Burton | 523/213 |
| 3,833,534 | 9/1974 | Tierney et al. | 524/262 |
| 3,868,017 | 8/1975 | Menikheim et al. | 427/304 |
| 4,160,049 | 7/1979 | Narcus | 427/305 |
| 4,349,421 | 9/1982 | Khattab | 156/668 |

*Primary Examiner*—George F. Lesmes
*Assistant Examiner*—E. Rollins Buffalow
*Attorney, Agent, or Firm*—Richard A. Negin; Patrick L. Henry

[57] ABSTRACT

Disclosed is an improved process for preparing metal plated thermoplastic compositions by electroless metal deposition and subsequent electrolytic plating. This process comprises the sequence of etching a filled thermoplastic resin substrate with dilute acid solution, treating with a sensitizer such as a tin salt, activating with a noble metal salt solution, electroless metal deposition using an electroless copper or nickel plating solution, and electrolytic plating with a metal selected from the group consisting of copper, nickel, chromium, or combinations thereof. The improvement is in the use of a wollastonite filler having an average particle size of less than about 3.5 microns, wherein 95 numerical percent of the particles are smaller than 10 microns in the longest dimension. The resulting electroplated articles exhibit a mirror-like finish and a peel strength of at least about 3 lbs./in. Also disclosed is a nylon-6 plating composition useful in the process containing the above-described wollastonite filler and an organosilane coupling agent.

10 Claims, No Drawings

METAL PLATED POLYAMIDE ARTICLES

DESCRIPTION

CROSS REFERENCE TO RELATED APPLICATIONS

This is a continuation of U.S. application Ser. No. 075,855, filed Sept. 17, 1979, which is a continuation-in-part of U.S. application Ser. No. 935,044, filed Aug. 18, 1978 now abandoned, which is a continuation-in-part application of U.S. application Ser. No. 849,146 filed Nov. 7, 1977 now abandoned.

BACKGROUND OF THE INVENTION

1. Field of the Invention

This invention relates to a process for electroplating the surface of thermoplastic resin articles and new filled nylon-6 resins for use therein. The resulting metal plated thermoplastic articles have both excellent adhesion between the metal and the thermoplastic resin as well as excellent appearance of the finished metal surface.

2. Discussion of the Prior Art

The demand for low cost metal plated plastic articles has been rapidly increasing. These metal plated articles can have either a metallic function, metallic appearance or both, and are used in such industries as automotive, home, appliance, radio and television, decorative containers, etc.

Before being plated, the surface of the plastic articles have to be treated to render them electrically conductive and also to modify them so that the electrodeposited metal adheres well thereto.

Basic to the conventionally known plastic plating processes are the steps of: A. Preconditioning the surface of the article by chemical etching or mechanical roughening in order to promote bonding with the coatings to be applied later. The chemical etchant is generally a strong oxidizing acid etch containing, for example, chromic acid with sulfuric or phosphoric acid. B. Sensitizing and activating the surface by applying a metallic catalyst usually by depositing the metal from a solution of its salts by chemical reduction. This is accomplished by immersing the substrate in a solution of stannous chloride or other source of stannous ions followed by immersion in a solution of palladium chloride or silver nitrate or immersing the substrate in a colloidal catalyst solution comprised of stannous and palladium ions followed by treatment with an acid accelerator to deposit the palladium. C. Electroless metal deposition of copper or nickel by immersing the substrate in an electroless copper or nickel containing bath. D. Electrolytically plating copper, nickel, chromium, or combinations thereof.

An important factor affecting the electroless metal coverage, adhesion, and appearance of the final product is step A (above); preconditioning the surface. If the surface of the substrate is not sufficiently etched, good metal to substrate adhesion is not obtainable. Excessive etching, on the other hand, will not promote good adhesion, but the surface of the final product will have a poor appearance. By "final product" we mean the electroplated article.

Electroplating processes are known in the art. For example, Japanese Pat. No. 50 14,676, discloses the plating of polyamides by substituting either a 7 to 18 wt% HCL or 20 to 40 wt% $H_2SO_4$ solution for the chromic acid/sulfuric acid etch more commonly used. However, there is no discussion regarding the quality of the finish obtained.

Japanese Pat. No. 75 51,426 teaches the plating of unsaturated polyester thermoset resins, wherein the resins are filled with a filler component comprised of 16 parts per hundred resin (phr) $TiO_2$, 35 phr $SiO_2$ and 60 phr CaO. A 30% HCL solution is used as the etchant. However, the silica filler is not suitable for attack by dilute acid solutions and CaO is highly alkaline and could have an adverse effect on the molecular weight of thermoplastics, such as the polyamides during their high temperature processing and compounding.

U.S. Pat. No. 3,688,017 describes an improved surface activating step for polyamide articles during an electroplating process. The article is briefly exposed to an aqueous solution of a reducing acid to ionize surface groups, in order to improve receptivity and adhesion of the nylon surface for metal plating. The process requires thorough washing of the treated surface prior to treatment with noble metal catalysts.

SUMMARY OF THE INVENTION

We have unexpectedly found that a thermoplastic resin filled with a very fine particle filler which can be attacked by dilute acid, can be electroplated to yield a final product, such as an automobile door handle, which has excellent mirror-like finish and good adhesion between the polymer and metal surfaces.

The filler must not degrade the thermoplastic resin and should have an average particle size of below about 3.5 microns, wherein 95 numerical percent of the particles are less than 10 microns in their longest dimension. Preferably the average particle size is about 2.5 to 3.3 microns.

Preferred fillers for the thermoplastic resin include metal metasilicates, particularly calcium metasilicate, i.e., wollastonite, preferably present in an amount of about 30 to 45 weight percent based on the combined weight of thermoplastic resin and filler.

Preferred thermoplastic resins include the polyamides, particularly polyepsiloncaprolactam.

The electroplated article has a peel strength of at least about 3 lbs. per linear inch and preferably of about 6 lbs. per inch up to about 10 lbs. per linear inch.

In accordance with this invention there is provided an improved method for electroplating the surface of a shaped article wherein the shaped article is comprised of a thermoplastic resin and about 5 and 60 wt. % based on the total weight of the resin and filler, of a filler component which will not degrade the thermoplastic resin and which is comprised of at least 5 wt. %, based on the total weight of the resin and filler, of a mineral filler which is susceptible to attack by dilute acid solutions, which is treated with a coupling agent, which method includes:

(a) treating the surface of the shaped article with a dilute acid solution of sufficient concentration, at temperature of about 30° and 50° C. and for a sufficient length of time, for said acid solution to attack and remove the filler at or near the surface of the article, but not attack the thermoplastic resin, and (b) sensitizing and activating the surface of the article obtained in step (a);

(c) depositing a layer of copper or nickel onto the surface of the shaped article by electroless deposition following step (b); and, (d) electrolytically plating the surface of said article with copper, nickel, chromium, or combination thereof, following step (c);

the improvement which comprises employing the filler in an average particle size below about 3.5 microns, wherein 95 numerical percent of the particles are less than about 10 microns in their longest dimension, thereby resulting in an electroplated shaped thermoplastic article having a mirror-like finish and possessing a metal-polymer peel strength of at least about 3 lbs. per inch.

Also a subject of the invention is an electroplated thermoplastic article prepared by the subject process.

Further provided is a composition comprising polyepsiloncaprolactam, containing up to about 60 weight percent wollastonite filler, based upon the combined weight of said polyepsiloncaprolactam and wollastonite, and 0.1 to 2 weight percent of an organosilane coupling agent, based upon said wollastonite, wherein the wollastonite is dispersed in the polyepsiloncaprolactam to such a degree that the drop weight impact of the composition, as measured by ASTM D-2444, is greater than about 25 ft. lbs.

DETAILED DESCRIPTION OF THE INVENTION

The reason why a thermoplastic resin, filled with very fine particle size filler and capable of being chemically removed by dilute acid solutions, yields electroplated articles having a mirror-like finish and good polymer-metal adhesion is not well understood. One theory, that we do not wish to be bound by, is that the dilute acid chemically removes the embedded fine particles on the surface of the thermoplastic resin to create a plurality of very small holes, cracks and crevices, which serve as "minute anchors" for the electroplated metal layer after coating. The use of a very fine particle size filler would therefore allow the formation of a greater number of such holes to enhance this "anchoring" effect. In addition, because the resulting etched holes would be very small in average diameter, the electroplating process would be more successful in filling individual holes with plated metal to the level of the surface of the resin. Coarser particles would result in larger diameter holes which on the average would be more difficult to completely fill with plated metal thus resulting in slightly concave depressions. This is probably the physical origin of the observed "orange peel" effect, present in the overlying metal surface, which is highly undesirable from a cosmetic and commercial viewpoint.

In addition, the improved process embodies the judicious selection of ingredients and conditions for etching the thermoplastic substrate surface. As a result, the polymer chains themselves are not attacked by the etchant and therefore remain virtually unchanged during the entire plating procedure. The etchant employed being a nonchromic acid type, such as a reducing acid, preferably hydrochloric acid, is designed to attack and remove the filler particles located at or near the surface of the substrate of the metal to the thermoplastic surface but not too deep wherein either the adhesive or the appearance of the plated product would be adversely affected. Generally the average depth of the pores, crevice, pits, etc. left by removal of the filler is from about 1 to 30 microns although somewhat lesser and greater depths are also suitable. Preferred are depths from 2 to 25 microns. The removal of a filler particle at the surface of the substrate can expose another underlying or adjacent particle, or a very thin layer of polymer can be covering the filler particle. This thin layer could allow permeation of the dilute acid etch solution, thereby attacking and removing the thinly covered filler particle. It will be noted that the fillers used herein have the added advantage of reinforcing the thermoplastic resin by substantially improving their mechanical properties. For example, when the fillers described herein are incorporated into a polyamide such as polyepsiloncaprolactam (nylon 6), the flexural modulus of the polyamide is increased from about 400,000 psi to as much as about 800,000 psi, and the tensile strength is increased from about 8,000 psi to as much as about 13,000 psi.

Thermoplastics suitable for use in the present invention are those random, block and graft thermoplastics having ester, carbonate, and/or amide linkages or combinations thereof and having a weight average molecular weight of at least about 10,000. Non-limiting examples of such thermoplastics are the polyesters such as polyethylene terephthalate, polybutylene terephthalate and polycarbonates, also ethylene acrylic acid copolymer and its esters, ethylene maleic acid copolymer and its esters, styrene containing ester, carbonate or amide groups and also any of the above which also contains at least one halogen group wherein the halogen can be chlorine, bromine, fluorine, or iodine or mixtures thereof. Also suitable for use herein are the polyamides and mixtures thereof. Preferred are interpolymers comprised of one or more polyamide resins and one or more additional polymers selected from the aforementioned group. Most preferred are polyamide interpolymers comprised of a polyamide and one or more comonomers. Particularly preferred are polyamide homopolymers.

Polyamides suitable for use in the present invention include the long chain polymeric amides having recurring amide groups as part of the polymer backbone and preferably a number average molecular weight, as measured by membrane osmometry, of about 15,000 to 40,000.

Non-limiting examples of such polyamides are: (a) those prepared by the polymerization of lactams, preferably epsilon-caprolactam (nylon 6); (b) those prepared by the condensation of a diamine with a dibasic acid, preferably the condensation of hexamethylene diamine with adipic acid (nylon 6,6) and the condensation of hexamethylene diamine with sebacic acid (nylon 6, 10); (c) those prepared by self-condensation of amino acids, preferably self-condensation of 11-aminoundecanoic acid (nylon 11); and (d) those based on polymerized vegetable oil acids, or random, block, or graft interpolymers consisting of two or more of these polyamides. Preferred polyamides are polyepsiloncaprolactam, polyhexamethylene adipamide, and a copolymer of polyepsiloncaprolactam and polyhexamethylene adipamide.

Also suitable for use herein are polyamide interpolymers comprised of a polyamide and one or more comonomers. Non-limiting examples of such conomoners include acrylic or methacrylic acid and/or their derivatives, such as acrylonitrile, acrylamide, methyl, ethyl, propyl, butyl, 2-ethylhexyl, decyl and tridecyl esters of acrylic or methacrylic acid, vinyl esters such as vinyl acetate and vinyl propionate; vinyl aromatic compounds such as styrene, α-methylstyrene, and vinyl toluenes and vinyl esters such as vinyl isobutyl ether.

It will further be noted that the aforementioned polyamides containing various terminal functionality are also suited for use in the present invention. Preferred are the polycaprolactams (nylon 6) containing, (a) a carboxyl group attached to both ends of the polymer chain, (b) a carboxyl group attached to one end and an acetamide group attached to the other end of the polymer chain, (c) an amino group attached to both ends of the polymer chain, (d) a carboxyl group attached to one end and an amino group attached to the other end of the polymer chain. Particularly preferred is (d) above, a polycaprolactam having a carboxyl group attached to one end and an amino group attached to the other end of the polymer chain.

Fillers suitable for use herein are mineral fillers wherein the filler is susceptible to attack by dilute acids and which will not attack and degrade the thermoplastic substrate. Further, the mineral filler must have a particle size below about 3.5 microns, preferably about 2.5–3.3 microns, wherein 95 numerical percent of the particles are less than about 10 microns in the longest dimension. Average particle size below 2.5 microns are also suitable for use herein. Use of fillers having a larger particle size results in electroplated articles wherein either the finish exhibits an "orange peel" effect or "fuzzy reflected image" and/or the metal-polymer adhesion has a peel strength of less than about 3 lbs. per inch.

Amount of filler used is about 5 to 60 wt. percent, based on the combined weight of thermoplastic resin and filler, and preferably, about 30 to 45 wt. percent filler is used based on the combined weight of resin and filler.

The average particle size and percentage of particles in the longest dimension were determined by the standard image analyzing technique using a Leitz-TAS ™ image analyzing apparatus. Filler particles were dispersed in glycerol, subjected to ultrasonic vibration to prevent aggregation and then viewed under a microscope by the apparatus. Particle count was accumulated and tabulated using a standard computer program for this purpose.

By the term "mirror-like finish," as used herein, is meant the reflected image, seen by an observer, in which the reflected image is characterized by sharp features, and not a "fuzzy reflected image" in addition to the absence of an "orange peel" effect. The test for a "mirror-like" finish is a visual comparison observation, commonly used in the automotive industry, against a standard sample having the desired finish.

By the term "susceptible to attack by dilute acid solutions" is meant a filler, which when brought in contact with the dilute acid etch solution, results in the formation of a soluble or partially soluble new compound which is then extracted out of the surface. By not attacking the thermoplastic substrate is meant those fillers which when mixed with the thermoplastic resin, will not attack and destroy the polymer chain linkages and cause molecular weight degradation under the process conditions.

Non-limiting examples of mineral fillers suitable for use in the present invention are metal salts and minerals such as: (a) the metal carbonates, wherein the metal is selected from the group consisting of barium, bismuth, cadmium, calcium, cobalt, copper, lead, magnesium, iron, nickel and zinc; (b) the metal oxides wherein the metal is selected from the group consisting of aluminum, antimony, bismuth, cadmium, cerium, cobalt, copper, gallium, germanium, indium, iron, lead, manganese, nickel, tin, zinc and zirconium; (c) the metal hydroxides wherein the metal is selected from the group consisting of bismuth, cerium, cobalt, copper and manganese; (d) the metal oxalates, wherein the metal is selected from the group consisting of aluminum, calcium, cobalt, iron, lead, magnesium, manganese, nickel and tin; (e) the metal orthophosphates, wherein the metal is selected from the group consisting of aluminum, cadmium, cerium, chromium, cobalt, lead, lithium, magnesium, nickel, strontium, tin and zinc; (f) the metal metasilicates, wherein the metal is selected from the group consisting of barium, calcium, lead and lithium; and (g) the metal pyrophosphates, wherein the metal is selected from the group consisting of magnesium, manganese and nickel. Also suitable for use as a mineral filler herein are calcium aluminate, calcium metaborate, calcium molybdate, calcium metatungstate, sodium aluminate, sodium potassium aluminate, and sodium aluminum silicate. It will also be noted that metal powders such as cerium, aluminum, zinc, tin and magnesium are also suitable for use as fillers herein. More preferred are the metal metasilicates, and most preferred of the metasilicates is calcium metalsilicate, i.e. wollastonite. It will be noted that some of the generic classes of metal salts include materials which will attack the thermoplastic resin and are therefore not suitable for use herein. For example, the generic class of metal oxides includes calcium oxide which is not suitable for use according to the present invention because it will attack and degrade the thermoplastic resin. Therefore it is important that fillers be used herein which will not attack the thermoplastic resin. Suitable fillers from the standpoint of activity against the thermoplastic resins may be readily ascertained by routine experimentation.

It is also an embodiment of the present invention to include up to 55 wt. %, based on the total weight of the thermoplastic resin and filler, of a filler which is not susceptible to attack by dilute acid solutions in combination with those aforementioned fillers which are susceptible to attack by dilute acid solutions. It is also required that these fillers also not attack the thermoplastic resin. As long as a minimum of 5 wt. %, based on the total weight of the thermoplastic resin and filler, of filler which is susceptible to attack by dilute acid solutions is incorporated in the compositions herein, the filler thermoplastic surface will be properly etched for electroless metal plating. For example, if the filled thermoplastic composition contains 60 wt. % filler, then 5 to 60 wt. % of a filler susceptible to attack by acid may be used.

A particlarly preferred embodiment of the present invention is in a method for electroplating the surface of a shaped thermoplastic article, comprised of a polyepsiloncaprolactam resin and about 30 to 45 wt. %, based on the total weight of said resin, if wollastonite filler, which is treated with an organosilane coupling agent, which method includes:

(a) treating the surface of the shaped article with 2–4 Normal hydrochloric acid at 30° to 50° C. for a sufficient length of time for said acid to attack and remove said wollastonite filler at or near the surface said resin, but not attack the resin;

(b) sensitizing and activating the surface of the article obtained in step (a) by immersing in a metal ion solution;

(c) depositing a layer of copper or nickel onto the surface of the shaped article by electroless deposition following step (b);

(d) electrolytically plating the surface of said article with copper, nickel, chromium, or combination thereof, following step (c);

the improvement which comprises employing said wollastonite in an average particle size of about 2.5 to 3.5 microns, wherein 95 numerical percent of the particles are less than about 10 microns in their longest dimension, thereby resulting in an electroplated shaped polyepsiloncaprolactam article having a mirror-like metal finish and possessing a metal-polymer peel strength of at least about 3 lbs. per linear inch up to about 10 lbs. per linear inch.

The filler and thermoplastic resin can be blended and/or compounded either before or during extrusion by any conventional plastic processing equipment which results in a homogenous dispersion of the filler in the thermoplastic resin matrix. The blended composition is extruded and preferably molded into the desired shape prior to plating. Before compounding, the filler is treated with one or more coupling agents such as the organosilane compounds, titanate compounds and the like. Preferred are the organosilane compounds such as gamma aminopropyltrimethoxysilane and the like. These coupling agents promote a stronger bond between the filler and the thermoplastic resin. The thermoplastic compositions herein can also include a heat stabilizer system such as a copper salt and potassium iodide or any other conventionally known organic or inorganic heat stabilizer.

A preferred composition for use in the subject process described herein is a composition comprising polyepsiloncaprolactam, containing up to about 60 wt. percent wollastonite filler, based upon the combined weight of said polycaprolactam and wollastonite, and 0.1 to 2 weight percent on an organosilane coupling agent, based upon said wollastonite, wherein the wollastonite has an average particle size below about 3.5 microns, and wherein 95 numerical percent of the particles are less than about 10 microns in their longest dimension, wherein the wollastonite filler is dispersed in the polycaprolactam to such a degree that the drop weight impact of the composition, as measured by ASTM D-2444 using Tup A, is greater than about 25 ft-lbs.

Preferably, the wollastonite filler is present in an amount of about 30 to 45 wt. percent of the combined weight of polyepsiloncaprolactam and wollastonite, or in lower amounts, and preferably the organosilane coupling agent is gamma aminopropyltrimethoxysilane or gamma aminopropyltriethoxysilane.

The composition is prepared by mixing the ingredients in a high intensive energy mixing apparatus, such as a Farrell Continuous Mixer. The mixing is such that a homogeneous dispersion of the wollastonite filler is achieved in the polyepsiloncaprolactam resin, Preferably, the wollastonite is coated with the organosilane coupling agent prior to the mixing step. The degree of dispersion of the wollastonite in the resin is such that the final composition exhibits a drop weight impact (ASTM D-2444, Tup A) of at least about 25 ft. lbs. This value of drop weight impact and higher, is considered to be desirable in the automotive industry for fabrication electroplated automotive parts such as door handles, mirror frames and the like.

A particularly preferred embodiment of this invention is an electroplated article produced by employing the above subject composition in the subject process.

Dilute acid solutions suitable for use as etchants in the present invention are those acid solutions, not containing chromic acid, having a normality (N) of about 4.0 or less, preferably about 2 to 3 N. Non-limiting examples of acids suitable for use in the present invention include the organic acids such as acetic acid, propionic acid, citric acid, tartaric acid, phenyl sulfonic acid, toluene sulfonic acid, also the mineral acids such as hydrochloric acid, nitric acid, phosphoric acid, sulfuric acid and hydrobromic acid. Preferred are the mineral acids, more preferred are hydrochloric acid and nitric acid, and most preferred is hydrochloric acid.

Generally, the process of plating the filled thermoplastic compositions of the present invention can optionally be initiated by first immersing the substrate in a dilute alkaline solution containing detergents at 25° to 40° C. for 2 to 5 min. in order to remove grease and surface grime picked up during handling of the substrate prior to plating.

The substrate is etched by immersing the substrate in a dilute acid solution at sufficient temperatures, preferably 30° to 50° C., and more preferably 35° to 45° C. for a period of time sufficient to properly etch the substrate surface, for example 3 to 10 minutes, preferably 5 to 7 minutes. Particular combinations of process conditions can be adjusted by routine experimentation to achieve a sufficiently etched surface by removing the filler at or near the surface of the substrate without attacking the thermoplastic resin. The substrate is then sensitized by immersing the substrate in a readily oxidizable tin salt solution such as stannous chloride to be adsorbed on the substrate surface. The substrate is then activated or nucleated by immersing the substrate in an aqueous solution of a noble metal salt such as palladium chloride or silver nitrate, preferably palladium chloride, which leaves palladium particles on the substrate surface, generally in the crevices of the substrate surface the activated surface is then subjected to electroless plating by immersing the treated substrate in a electroless plating solution of metal salt wherein the metal is selected from those described in the prior art, such as copper, nickel or cobalt. Preferred is copper and nickel. It will be noted that in addition to the metal salt, it is preferred that the electroless plating solution contain a reducing agent such as formaldehyde, trioxymethylene, or the like.

When copper is the desired metal for electroless plating, the plating solution will preferably contain a copper salt such as copper sulfate, a reducing agent as described herein, a complexing agent such as tartaric acid or ethylenediaminetetraacetic acid, a stabilizer such as a cyanide ion or mercaptobenzothiazole, and a buffering agent such as sodium hydroxide wherein the buffering agent is such that it maintains the plating solution at a pH of about 11 to 13. When nickel is the desired metal for electroless plating, the plating solution will preferably contain a nickel salt such as nickel sulfate and nickel chloride, a reducing agent such as sodium hypophosphite, a complexing and buffering agent such as ammonia wherein the buffering agent is capable of maintaining a pH of about 8 to 10. It will also be noted that other ingredients conventionally used in the art can also be incorporated into the electroless plating solutions of the present invention. Although it is preferred to immerse the substrate in the various solutions described herein, it is also understood that other conventional means can be used such as spraying the solutions on the substrate.

Sufficient metal is deposited on the surface of the substrate to form a continuous metal film capable of conducting electricity. The coated substrate is then conventionally electrolytically plated preferably with copper, followed by nickel or chromium, or with nickel followed by chromium. The thickness of the electroplated coating is generally from about 0.1 to 10 mils, preferably about 0.5 to 5 mils, more preferably about 1 to 2 mils.

It is desirable to rinse the surface of the substrate with water following each of the foregoing steps except with the acid etch which is not necessary. Since the various outlined steps employed in the electroplating of the filled thermoplastic compositions of the present invention are well known in the electroplating art, except for the dilute acid etch, no further description of these known steps is deemed necessary for a full understanding of the present invention.

When filled polyamide substrates are metal plated according to the present invention, the adhesion, metal-polymer peel strength, or simply "peel strength", of the metal to polymer substrate, as it is known in the art, is at least about 3 lb per inch, and preferably from about 6 lb per inch up to about 10 lb per inch. Higher peel strengths are also obtainable by the subject process. A peel strength of at least about 3 lbs. per inch is usually necessary with standard thicknesses of plated metal, in order for the plated article to pass a standard automotive specification thermal cycling test, e.g. General Motors Tests: GM-4372M and GM-4373M for example, without peeling, blistering or cracking. The above thermal tests which were used herein consisted of maintaining the final plated substrate at a temperature of 185° F. for 1 hour, followed by 15 minutes at room temperature, followed by maintaining the plated substrate at 30° F. for 1 hour then finally at room temperature for 15 minutes. This cycle is repeated four times whereupon the plated substrate is examined for cracking, peeling, blistering or other surface imperfections. Good adhesion is obtained according to the present invention without the need for oven baking or prolonged aging at room temperature. Adhesion values of the plated polyamide compositions of the present invention were obtained by pulling the metal layer from the polyamide substrate in an Instron tester at a 90° angle and at a rate of 2 inches per minutes. At one end of a 1 inch wide plate strip, the plated metal is pulled loose from the substrate for about ½ to ¾ or an inch. A clamp attached to a wire is attached to the loose metal tab. The substrate is attached to the traverse in the Instron tester and the wire to the upper jaw of the Instron tester. The wire is situated so that the angle does not change appreciably as the metal is pulled at a right angle from the thermoplastic substrate. The average value of the force, in pounds, required to separate the metal from the substrate is recorded in pounds per linear inch.

Also a subject of this invention is an electroplated thermoplastic article prepared according to the subject process. Such articles include, for example, interior and exterior metal plated plastic automobile parts such as door handles and mirror frames.

Also, a preferred thermoplastic article is that prepared according to the particularly preferred embodiment of the subject process described hereinabove.

The following examples are representative of the best mode of carrying out the invention as contemplated by us and should not be construed as being limitations on the scope and spirit of the instant invention.

EXAMPLE 1

Calcium metasilicate, having an average particle size of about 2.7 microns, wherein 95 numerical percent of the particles are below 10 microns in the longest dimension, was treated with an aqueous solution containing 1%-amino-propyltriethoxysilane and 10% methanol such that the total amount of silane in the filler was 1%. The mixture was blended in a ribbon blender and air oven dried at 105° C. for 1 hour. The mixture was dry-blended with nylon-6 such that 40 wt. % of the blend was calcium metasilicate. The nylon 6 used herein had a melt index of 4.8 as measured by ASTM D-1238 and a FAV (formic acid viscosity) of 65.4. All weight percents are based on the total weight of ingredients. The blend was fed into 2" diameter Farrel continuous mixer at a melt temperature of 530°-630° F. and extruded into strands which were pelletized into ⅛-inch diameter pellets. The pellets were dried in a vacuum oven at 85° C. overnight after which the moisture level of said pellets was found to be below 0.1%. The pellets were then injection molded into plaques having the dimensions 6"×4"×⅛". These plaques were used for subsequent plating and testing procedures.

A sample plaque was metal plated by first etching the surface of the plaque by immersing the plaque in a dilute HCl solution at 40° C. for 7 minutes. The dilute (3.1 N) HCl solution was prepared by diluting to 1000 ml with distilled water, 250 ml of chemically pure 36% HCl solution. This represented 10.6% dry HCl. The temperature of the dilute HCl solution was maintained at 40° C. and mechanical agitation was maintained throughout. Examination of the etched surface by scanning electron microscopy (SEM) showed a substantial degree of pores, crevices and pits created on the surface having an average diameter of 0.1 to 3.5 microns.

The plaque was then activated by immersing for 2 minutes, in Macuplex ™ D-34 (MacDermid) being a solution of stannous chloride/palladium chloride in aqueous hydrochloric acid. The plaque was then rinsed in cold water for 2 minutes. Following this, the plaque was immersed for 2 minutes in Macuplex 9338 accelerator (MacDermid), being a solution of alkali metal chlorides in aqueous hydrochloric acid. The plaque was then rinsed in cold water for 2 minutes.

The plaque was next immersed in an electroless copper bath D-9387 (MacDermid) for 15 minutes at 60° C. After electroless plating, the plaque was electrolytically plated in a solution containing copper sulfate, sulfuric acid, hydrochloric acid, brighteners and a wetting agent. The plaque was subjected initially to low current, (for example, 3-5 amperes per square foot of surface (ASF) then subjected to about 40-60 ASF for 30 minutes. A bright copper layer with a mirror-like finish was deposited having a thickness of about 2 mils.

The peel strength of the plated plaque was found to be about 10 lbs/linear inch without the need for baking.

COMPARATIVE TEST 1

The procedure of Example 1 was followed except that the calcium metasilicate had an average particle size of about 8.2 microns. The resulting plaque did not exhibit a copper layer having a mirror-like finish, but rather an undesirable orange-peel type finish.

EXAMPLE 2

The procedure of Example 1 was followed except that after activation the plaque was electroless plated with nickel by immersing the plaque in an electroless nickel bath, Macuplex 9340 (Mac Dermid), having a pH of 9 at 30° C. for 15 minutes.

The plaque, after electrolytic plating, was found to have a peel strength of 8 lbs/linear inch without the need for baking, and a mirror-like metal finish.

COMPARATIVE TEST 2

The procedure according to Example 1 was followed except that a fine particle size clay mineral filler, not susceptible to attack by dilute acid solutions, was used instead of calcium metasilicate.

After immersion in the dilute HCl etch solution, the plaque was unable to be electroless plated with either copper or nickel. Examination of the plaque surface by SEM revealed no substantial etching of the surface.

This example demonstrates that it is critical to the present invention that a mineral filler be used which is susceptible to attack by dilute acid solutions. The dilute acid etch is unable to attack either the polyamide matrix or the filler, thereby leaving the plaque surface virtually unchanged after the etching step.

EXAMPLE 3

Nylon 6 articles having the composition as set forth in Example 1 were immersed in a 3 NHCl solution at 40° C. for 5 minutes. The articles were not rinsed with water immediately following the HCl treatment but were immediately immersed at 35° C. for 2 minutes in a standard plating chemical colloidal activator solution comprised of stannous chloride and palladium chloride in a 3 N HCl solution and commercially available from Mac Dermid Inc. under the designation D-34. The articles were rinsed with water then immersed at 50° C. for 2 minutes in a standard plating chemical accelerator solution comprised of sodium chloride and palladium chloride in a 0.7 HCl solution also commercially available from MacDermid Incorporated but under the designation Macuplex D-45.

After rinsing, the article was electroless nickel plated using a standard plating chemical commercially available from MacDermid Incorporated under the designation Macuplex 9340, rinsed, then electrolytically plated in a commercially available copper solution, Enthobrite TM Cu-07297. The peel strength of the plate was found to be between 7 and 8 lbs/inch immediately after plating without aging. The deposited copper layer exhibited a mirror-like finish.

This example demonstrates that it is not necessary to water rinse an article to be plated immediately after the dilute acid etch treatment. The article can be immersed in an actuator or sensitizer solution directly from the dilute acid etch treatment.

COMPARATIVE TESTS 3 & 4

Two compositions were prepared in a Farrel Continuous Mixer using polyepsiloncaprolactam having a melt index of 4.2 g/10 min. and wollastonite as the filler. The compositions also contained 1 wt.%, based on the weight of filler, gamma aminopropyltrimethoxysilane coupling agent. The first composition contained 60.3 wt.% polyepsiloncaprolactam and 38.7 wt.% wallastonite. The second composition contained 60 wt.% polyepsiloncaprolactam and 40 wt.% wollastonite. The wollastonite of both compositions had a 50% median particle size of about 5.5 microns with 74% of the particles being below 10 microns and 97% below 20 microns. Drop weight impact of each composition was measured according to the procedure set forth in ASTM D-2444 (using Tup A) and the first composition was found to have an impact strength of 3.8 ft. lbs. and the second, 3.3 ft. lbs.

Examples 4–9

Various polyepsiloncaprolactam compositions were prepared in a Farrel Continuous Mixer using wollastonite as a filler and 0.5 wt.% gamma aminopropyltriethoxysilane coupling agent. Table I below sets forth the concentration of ingredients for each composition as well as the resulting impact strength. The wollastonite used in these compositions had an average particle size of about 3.0 microns, where about 95% of the particles were below 10 microns in the longest direction and 99% were below 20 microns in the longest direction.

TABLE I

| Example | Resin[1] Wt. % | Resin[2] Wt. % | Wollastonite Wt. % | Izod, no. Notch, ft. lbs. |
|---|---|---|---|---|
| 4 | 32.7 | 32.7 | 34.6 | 41.8 |
| 5 | 65.0 | 0 | 35.0 | 63.0 |
| 6 | 33.9 | 33.9 | 32.2 | 44.7 |
| 7 | 30.3 | 30.7 | 39.3 | 44.8 |
| 8 | 30.6 | 30.6 | 38.7 | 43.3 |
| 9 | 29.6 | 29.6 | 40.7 | 38.8 |

| Example | Drop Weight Impact, ft. lbs. | Tensile Strength, Psi | Flexural Strength, Psi | Flexural Modulus, Psi × 10$^5$ |
|---|---|---|---|---|
| 4 | 57.0 | 13,292 | 19,880 | 7.30 |
| 5 | 57.0 | 13,165 | 19,270 | 7.01 |
| 6 | 42.1 | 11,661 | 20,070 | 7.56 |
| 7 | 25.0 | 12,357 | 21,000 | 8.27 |
| 8 | 43.0 | 12,207 | 20,481 | 8.07 |
| 9 | 38.3 | 12,754 | 21,407 | 8.32 |

[1]Polyepsiloncaprolactam having M.I. 4.2 and FAV 75.3
[2]Polyepsiloncaprolactam having M.I. 9.45 and FAV 47.8

These examples illustrate that finer particle size wollastonite of the type used herein produces compositions having desired drop weight impact of above 25 ft. lbs. as opposed to those compositions containing much coarser particle size wollastonite under identical high intensity mixing conditions.

What is claimed is:

1. An article of manufacture comprising: a substrate having a surface, the substrate comprising a polyamide resin and about 5 to 60 weight percent, of a wollastonite filler, based on the total weight of the resin and filler, the wollastonite filler component which will not degrate thermal plastic resin and which is susceptible to attack by dilute acid solutions, there being minute anchors at or near the surface of the substrate, the anchors being 1–30 microns deep; and a continuous layer of electrolessly platable metal adjacent to the surface of the substrate.

2. The article as recited in claim 1 further comprising a layer of electro plateable metal adjacent electrolessly plateable layer.

3. The article as recited in claim 1 or 2 wherein the surface of the substrate is activated.

4. The article as recited in claim 1 wherein the minute anchors are 2–25 microns deep.

5. The article as recited in claims 1 or 2 wherein the filler is treated with a coupling agent.

6. The article as recited in claim 5 wherein the wollastonite has an average particle size below about 3.5 microns and 95 numerical percent of the particles are below about 10 microns and their longest dimension.

7. The article as recited in claims 1 or 2 wherein the electrolessly plateable metal is selected from the group consisting of copper; nickel; and cobalt.

8. The article as recited in claim 1 wherein the electro plateable metal is selected from the group consisting essentially of copper, nickel, chromium, and a combination thereof.

9. The article as recited in claim 1 wherein the layer of electro plateable metal has a mirror like finish and a peal strength of at least three pounds per linear inch up to 10 pounds per linear inch.

10. The article as recited in claim 9 wherein the peal strength is from about six pounds per linear inch up to about 10 pounds per linear inch.

* * * * *

UNITED STATES PATENT AND TRADEMARK OFFICE
CERTIFICATE OF CORRECTION

PATENT NO. : 4,444,836
DATED : April 24, 1984
INVENTOR(S) : Ghazi M.A. Khattab

It is certified that error appears in the above–identified patent and that said Letters Patent are hereby corrected as shown below:

Claim 8, Col. 13, line 4, "claim 1" should read --claim 2--.

Claim 9, Col. 13, line 8, "claim 1" should read --claim 2--.

Signed and Sealed this

Twenty-eighth Day of August 1984

[SEAL]

Attest:

GERALD J. MOSSINGHOFF

Attesting Officer   Commissioner of Patents and Trademarks